US010985010B2

(12) United States Patent
Chandra et al.

(10) Patent No.: US 10,985,010 B2
(45) Date of Patent: Apr. 20, 2021

(54) METHODS FOR MAKING SILICON AND NITROGEN CONTAINING FILMS

(71) Applicant: Versum Materials US, LLC, Tempe, AZ (US)

(72) Inventors: Haripin Chandra, San Marcos, CA (US); Xinjian Lei, Vista, CA (US); Moo-Sung Kim, Ansan (KR)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/553,091

(22) Filed: Aug. 27, 2019

(65) Prior Publication Data

US 2020/0075312 A1    Mar. 5, 2020

Related U.S. Application Data

(60) Provisional application No. 62/724,205, filed on Aug. 29, 2018.

(51) Int. Cl.
*H01L 21/02* (2006.01)
*H01L 21/3105* (2006.01)

(52) U.S. Cl.
CPC ...... *H01L 21/0217* (2013.01); *H01L 21/0228* (2013.01); *H01L 21/02208* (2013.01); *H01L 21/3105* (2013.01)

(58) Field of Classification Search
CPC ............ C23C 16/45553; C23C 16/308; C23C 16/345; C23C 16/45542; C23C 16/56; H01L 21/02126; H01L 21/0228; H01L 21/02167; H01L 21/02208; H01L 21/0217
See application file for complete search history.

(56) References Cited

U.S. PATENT DOCUMENTS

| | | | |
|---|---|---|---|
| 8,912,101 B2* | 12/2014 | Tsuji | H01L 21/0217 438/782 |
| 9,460,912 B2* | 10/2016 | Chandra | C23C 16/402 |
| 10,453,675 B2* | 10/2019 | O'Neill | H01L 21/02211 |
| 2007/0065578 A1* | 3/2007 | McDougall | C23C 16/4404 427/248.1 |
| 2013/0244446 A1* | 9/2013 | Tsuji | C23C 16/345 438/778 |
| 2013/0295779 A1* | 11/2013 | Chandra | C23C 16/402 438/790 |
| 2015/0087139 A1* | 3/2015 | O'Neill | H01L 21/0228 438/482 |
| 2018/0023192 A1 | 1/2018 | Chandra et al. | |
| 2018/0033614 A1 | 2/2018 | Chandra et al. | |
| 2018/0127592 A1* | 5/2018 | Lei | C09D 1/00 |

OTHER PUBLICATIONS

Fracassi et al., Plasma Deposition of Silicon Nitride-like Thin Films from Organosilicon Precursors, 1996, Plasma and Polymers, vol. 1, No. 1, pp. 3-16, Jan. 1996. (Year: 1996).*
Kim, H., et al. "Dielectric Barrier Characteristics of Si-Rich Silicon Nitride Films Deposited by Plasma Enhanced Atomic Layer Deposition." Journal of Vacuum Science and Technology A., Nov. 30, 2016, vol. 35, No. 1, pp. 01A1011-01A1017, abstract and figures.

* cited by examiner

*Primary Examiner* — Nikolay K Yushin
(74) *Attorney, Agent, or Firm* — David K. Benson

(57) ABSTRACT

A composition and method for using the composition in the fabrication of an electronic device are disclosed. Compounds, compositions and methods for depositing a high quality silicon nitride or carbon doped silicon nitride.

18 Claims, No Drawings

METHODS FOR MAKING SILICON AND NITROGEN CONTAINING FILMS

CROSS-REFERENCE TO RELATED APPLICATIONS

This application claims priority to U.S. provisional application 62/724,205 filed on Aug. 29, 2018, the entire contents of which is incorporated herein by reference thereto for all allowable purposes.

FIELD OF THE INVENTION

The present invention is directed to compositions and methods for the fabrication of an electronic device. More specifically, the invention is directed to compounds, compositions and methods for the deposition of a dielectric constant (<7.0) and high oxygen ash resistant silicon-containing film such as, without limitation, a stoichiometric silicon nitride, a carbon-doped silicon nitride film, and a carbon-doped silicon oxynitride film.

BACKGROUND OF THE INVENTION

Silicon nitride films are used in semiconductor for a variety of applications. For example, the silicon nitride film is used as a final passivation and mechanical protective layer for integrated circuits, a mask layer for selective oxidation of silicon, as one of the dielectric materials in a stacked oxide-nitride-oxide (O—N—O) layer in DRAM capacitor or in 3D NAND flash memory chips, or as a CMP stop layer in a shallow trench isolation application. In one particular application, O—N—O stack in 3D NAND flash requires silicon nitride with low stress and high wet etch rate in phosphoric acid.

Olsen, "Analysis of LPCVD Process Conditions for the Deposition of Low Stress Silicon Nitride", 5 Materials Science in Semiconductor Process 51 (2002) describes a wide range or process conditions that are used to optimize the deposition of low stress silicon nitride films by low-pressure chemical vapor deposition. The results show that an increase in the index of refraction beyond 2.3 by means of increasing the gas flow did not reduce the residual stress appreciably but had a significant detrimental effect on the thickness uniformity and deposition rate.

Taylor et al., "Hexachlorodisilane as a Precursor in the LPCVD of Silicon Dioxide and Silicon Oxynitride Films", 136 J. Electrochem. Soc. 2382 (1989) describes growing films of silicon dioxide and silicon oxynitride by LPCVD using gas-phase mixtures of $Si_2Cl_6$, $N_2$, and $NH_3$. Films of silicon dioxide and silicon oxynitride were grown by LPCVD using gas-phase mixtures of HCDS, $N_2O$, and $NH_3$ in the temperature range 600-850° C. The deposited silicon dioxide and silicon oxynitride films exhibited low chlorine content, typically <1% atomic percent.

M. Tanaka et al., "Film Properties of Low-k Silicon Nitride Films Formed by Hexachlorodisilane and Ammonia", 147 J. Electrochem. Soc. 2284 (2000) describes a low-temperature process with good step coverage of silicon nitride (SiN) formed by low-pressure chemical vapor deposition (LPCVD) using hexachlorodisilane (HCD).

JP2000100812 describes a method for depositing a film using $SiCl_4$ and $NH_3$ as source gases. The substrate surface may be nitrided using $NH_3$ prior to deposition. An extremely thin film having an improved insulator property is formed. The silicon nitride film is useful as a capacitor insulator film of a semiconductor integrated circuit.

U.S. Pat. No. 6,355,582 describes a method for forming a silicon nitride film wherein the substrate to be subjected to the film formation is heated, and silicon tetrachloride and ammonia gases are supplied to the substrate heated to a predetermined temperature.

U.S. Pat. No. 10,049,882 describes an atomic layer deposition (ALD) method for fabricating a semiconductor device including the step of forming a dielectric layer on a structure having a height difference. The method includes forming a structure with a height difference on a substrate and forming a dielectric layer structure on the structure. Forming the dielectric layer structure includes forming a first dielectric layer including silicon nitride on the structure with the height difference. Forming the first dielectric layer includes feeding a first gas including pentachlorodisilane (PODS) or diisopropylamine pentachlorodisilane (DPDC) as a silicon precursor, and a second gas including nitrogen components into a chamber including the substrate such that the first dielectric layer is formed in situ on the structure having the height difference.

PCT Pub. No. WO2018063907 discloses a class of chlorodisilazanes, silicon-heteroatom compounds synthesized therefrom, devices containing the silicon-heteroatom compounds, methods of making the chlorodisilazanes, the silicon-heteroatom compounds, and the devices; and uses of the chlorodisilazanes, silicon-heteroatom compounds, and devices.

PCT Pub. No. WO2018057677 discloses a composition that includes trichlorodisilane as a silicon precursor for use in film forming. The composition includes the silicon precursor compound and at least one of an inert gas, molecular hydrogen, a carbon precursor, nitrogen precursor, and oxygen precursor. The publication also discloses a method of forming a silicon-containing. film on a substrate using the silicon precursor compound and the silicon-containing film formed thereby.

U.S. Pat. No. 9,984,868 discloses cyclical methods of depositing a silicon nitride film on a substrate. In one embodiment such a method includes supplying a halogen silane as a silicon precursor into a reactor; supplying a purge gas to the reactor; and providing an ionized nitrogen precursor into the reactor to react with the substrate and form the silicon nitride film.

Finally, US Pub. No. 2009/0155606 discloses cyclical methods of depositing a silicon nitride film on a substrate. In one embodiment a method includes supplying a chlorosilane to a reactor in which a substrate is processed; supplying a purge gas to the reactor; and providing ammonia plasma to the reactor. The method allows a silicon nitride film to be formed at a low process temperature and a high deposition rate. The resulting silicon nitride film has relatively few impurities and a relatively high quality. In addition, a silicon nitride film having good step coverage over features having high aspect ratios and a thin and uniform thickness can be formed.

There is a need in the art to provide a composition and method using same for depositing high carbon content (e.g., a carbon content of about 10 atomic % or greater as measured by X-ray photoelectron spectroscopy (XPS)) doped silicon-containing films for certain applications within the electronics industry.

Thus, there is a need to develop a process for forming high quality silicon nitride or carbon-doped silicon nitride using a chemical vapor deposition (CVD) or an atomic layer deposition (ALD) process or an ALD-like process, such as without limitation a cyclic chemical vapor deposition process. One particular application, e.g., O—N—O stack in 3D NAND flash, requires a silicon nitride, silicon oxynitride, or silicon carboxynitride films which exhibit low stress and/or high wet etch rate in phosphoric acid. Further, it may be desirable to develop a low temperature deposition (e.g., deposition at one or more temperatures of about 500° C. or lower) to improve one or more film properties, such as, without limitation, purity and/or density, in a CVD, an ALD, or an ALD-like process.

The disclosure of the previously identified patents, patent applications and publications is hereby incorporated by reference.

There is a need in the art to provide a composition and method using the same for depositing silicon nitride or carbon-doped silicon nitride having the following characteristic: a) a carbon content of about 5 atomic % or less, about 3 atomic % or less, about 2 atomic % or less, about 1 atomic % or even less as measured by X-ray photoelectron spectroscopy (XPS), preferably stoichiometric silicon nitride; b) oxygen content of about 5 atomic % or less, about 3 atomic % or less, about 2 atomic % or less, about 1 atomic % or less as measured by X-ray photoelectron spectroscopy (XPS); step coverage of 90% or higher, 95% or higher, 99% or higher, dielectric constant of 7.0 or less, 6.0 or less, and 5.0 or less

BRIEF SUMMARY OF THE INVENTION

The above-described needs are met in one respect by providing a method for forming a carbon-doped silicon nitride film via a plasma ALD process. According to the method, a substrate that includes a surface feature is introduced into a reactor. The reactor is heated to one or more temperatures ranging up to about 550° C., preferably one or more temperatures at 300° C. or less. The reactor may be maintained at a pressure of 100 torr or less. At least one silicon precursor is introduced into the reactor having two Si—C—Si linkages selected from the group consisting of 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,3,3,5,5-hexachloro-1,5-dimethyl-1,3,5-trisilapentane, 1,1,1,5,5,5-hexachloro-3,3-dimethyl-1,3,5-trisilapentane, 1,1,3,5,5-pentachloro-1,3,5-trimethyl-1,3,5-trisilapentane, 1,1,1,5,5,5-hexachloro-1,3,5-trisilapentane, 1,1,5,5-tetraachloro-1,3,5-trisilapentane, 1-iodo-1,3-disilacyclobutane, 1,1-diiodo-1,3-disilacyclobutane, 1,3-diiodo-1,3-disilacyclobutane, 1,1,3-triiodo-1,3-disilacyclobutane, 1,1,3,3-tetraiodo-1,3-disilacyclobutane, and 1,3-diiodo-1,3-dimethyl-1,3-disilacyclobutane to form a silicon-containing species on the substrate.

The reactor is purged of any unconsumed precursors and/or reaction by-products with a suitable inert gas. A plasma comprising nitrogen is introduced into the reactor to react with the silicon-containing species to form a carbon-doped silicon nitride film.

Next, the reactor is again purged of any reaction by-products with a suitable inert gas. The steps of introducing the precursor(s), purging as necessary, introducing the plasma, and again purging as necessary, are repeated as necessary to bring the deposited carbon-doped silicon nitride film to a predetermined thickness.

The above-described needs and others are yet further met by a method for forming a silicon nitride, carbon-doped silicon nitride, or carbon-doped silicon oxynitride film via a plasma ALD process. According to the method, a substrate that includes a surface feature is introduced into a reactor. The reactor is heated to one or more temperatures ranging up to about 550° C., preferably one or more temperatures at 300° C. or less. The reactor may be maintained at a pressure of 100 torr or less. At least one silicon precursor is introduced into the reactor having two Si—C—Si linkages selected from the group consisting of 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,3,3,5,5-hexachloro-1,5-dimethyl-1,3,5-trisilapentane, 1,1,1,5,5,5-hexachloro-3,3-dimethyl-1,3,5-trisilapentane, 1,1,3,5,5-pentachloro-1,3,5-trimethyl-1,3,5-trisilapentane, 1,1,1,5,5,5-hexachloro-1,3,5-trisilapentane, 1,1,5,5-tetraachloro-1,3,5-trisilapentane, 1-iodo-1,3-disilacyclobutane, 1,1-diiodo-1,3-disilacyclobutane, 1,3-diiodo-1,3-disilacyclobutane, 1,1,3-triiodo-1,3-disilacyclobutane, 1,1,3,3-tetraiodo-1,3-disilacyclobutane, and 1,3-diiodo-1,3-dimethyl-1,3-disilacyclobutane to form a silicon-containing species on the substrate.

The reactor is purged of any unconsumed precursors and/or reaction by-products with a suitable inert gas. A plasma that includes an ammonia source is introduced into the reactor to react with the silicon-containing species to form a silicon nitride or carbon-doped silicon nitride film.

Next, the reactor is again purged of any reaction by-products with a suitable inert gas. The steps of introducing the precursor(s), purging as necessary, introducing the plasma, and again purging as necessary, are repeated as necessary to bring the silicon nitride or carbon-doped silicon nitride film to a predetermined thickness.

Optionally the resulting silicon nitride or silicon carbon-doped silicon nitride film is then exposed to an oxygen source at one or more temperatures ranging from about ambient temperature to 1000° C., preferably from about 100° to 400° C., to convert the silicon nitride film into a silicon oxynitride film, or to convert the carbon-doped silicon nitride film into a carbon-doped silicon oxynitride film.

DETAILED DESCRIPTION OF THE INVENTION

Throughout the description, the term "ALD or ALD-like" refers to a process including, but not limited to, the following processes: a) each reactant including silicon precursor and reactive gas is introduced sequentially into a reactor such as a single wafer ALD reactor, semi-batch ALD reactor, or batch furnace ALD reactor; b) each reactant including silicon precursor and reactive gas is exposed to a substrate by moving or rotating the substrate to different sections of the reactor and each section is separated by inert gas curtain, i.e. spatial ALD reactor or roll to roll ALD reactor.

Throughout the description, the term "plasma including/comprising ammonia" refers to a reactive gas or gas mixture generated in situ or remotely via a plasma generator. The gas or gas mixture is selected from the group consisting of ammonia, a mixture of ammonia and helium, a mixture of ammonia and neon, a mixture of ammonia and argon, a mixture of ammonia and nitrogen, a mixture of ammonia and hydrogen, and combinations thereof.

Throughout the description, the term "inert gas plasma" refers to a reactive inert gas or inert gas mixture generated in situ or remotely via a plasma generator. The inert gas or gas mixture is selected from the group consisting of helium, neon, argon, and combination thereof.

Throughout the description, the term "ashing" refers to a process to remove the photoresist or carbon hard mask in semiconductor manufacturing process using a plasma comprising oxygen source such as $O_2$/inert gas plasma, $O_2$ plasma, $CO_2$ plasma, CO plasma, $H_2/O_2$ plasma or combination thereof.

Throughout the description, the term "damage resistance" refers to film properties after oxygen ashing process. Good or high damage resistance is defined as the following film properties after oxygen ashing: film dielectric constant lower than 7; carbon content in the bulk (at more than 50 Å deep into film) is within 5 at. % as before ashing; Less than 50 Å of the film is damaged, observed by differences in dilute HF etch rate between films near surface (less than 50 Å deep) and bulk (more than 50 Å deep).

Throughout the description, the term "alkyl hydrocarbon" refers a linear or branched $C_1$ to $C_{20}$ hydrocarbon, cyclic $C_6$ to $C_{20}$ hydrocarbon. Exemplary hydrocarbon includes, but not limited to, heptane, octane, nonane, decane, dodecane, cyclooctane, cyclononane, cyclodecane.

Throughout the description, the term "aromatic hydrocarbon" refers a $C_6$ to $C_{20}$ aromatic hydrocarbon. Exemplary aromatic hydrocarbon n includes, but not limited to, toluene, mesitylene.

Throughout the description, the term "an inert gas" refers a non-reactive gas. Exemplary inert gas includes, but not limited to, helium, argon, neon, nitrogen and combination thereof.

Throughout the description, the term "step coverage" as used herein is defined as a percentage of two thicknesses of the deposited film in a structured or featured substrate having either vias or trenches or both, with bottom step coverage being the ratio (in %): thickness at the bottom of the feature is divided by thickness at the top of the feature, and middle step coverage being the ratio (in %): thickness on a sidewall of the feature is divided by thickness at the top of the feature. Films deposited using the method described herein exhibit a step coverage of about 80% or greater, or about 90% or greater which indicates that the films are conformal.

Throughout the description, the term "plasma including/comprising nitrogen/nitrogen source" refers to a reactive gas or gas mixture generated in situ or remotely via a plasma generator. The gas or gas mixture is selected from the group consisting of nitrogen, a mixture of nitrogen and helium, a mixture of nitrogen and neon, a mixture of nitrogen and argon, a mixture of ammonia and nitrogen, a mixture of nitrogen and hydrogen, and combination thereof.

Described herein are silicon precursor compositions, and methods comprising such compositions, to deposit silicon nitride or carbon-doped silicon nitride having the following characteristic: a) a carbon content of about 5 atomic % or less, about 3 atomic % or less, about 2 atomic % or less, about 1 atomic % or even less as measured by X-ray photoelectron spectroscopy (XPS), preferably stoichiometric silicon nitride; b) oxygen content of about 5 atomic % or less, about 3 atomic % or less, about 2 atomic % or less, about 1 atomic % or less as measured by X-ray photoelectron spectroscopy (XPS); step coverage of 90% or higher, 95% or higher, 99% or higher.

In one aspect, the composition for depositing a silicon-containing film comprises: (a) at least one silicon precursor compound having one Si—C—Si or two Si—C—Si linkages selected from the group consisting of 1,1,1,3,3,3-hexachloro-1,3-disilapropane, 1,1,1,3,3,3-hexachloro-2-methyl-1,3-disilapropane, 1,1,1,3,3,3-hexachloro-2,2-dimethyl-1,3-disilapropane, 1,1,1,3,3,3-hexachloro-2-ethyl-1,3-disilapropane, 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,3,3,5,5-hexachloro-1,5-dimethyl-1,3,5-trisilapentane, 1,1,1,5,5,5-hexachloro-3,3-dimethyl-1,3,5-trisilapentane, 1,1,3,5,5-pentachloro-1,3,5-trimethyl-1,3,5-trisilapentane, 1,1,1,5,5,5-hexachloro-1,3,5-trisilapentane, 1,1,5,5-tetrachloro-1,3,5-trisilapentane, 1-iodo-1,3-disilacyclobutane, 1,1-diiodo-1,3-disilacyclobutane, 1,3-diiodo-1,3-disilacyclobutane, 1,1,3-triiodo-1,3-disilacyclobutane, 1,1,3,3-tetraiodo-1,3-disilacyclobutane, and 1,3-diiodo-1,3-dimethyl-1,3-disilacyclobutane, and; (b) at least one solvent.

TABLE 1

Silicon precursors having one Si—C—Si linkage

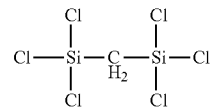

1,1,1,3,3,3-hexachloro-1,3-disilapropane

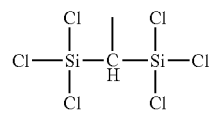

1,1,1,3,3,3-hexachloro-2-methyl-1,3-disilapropane

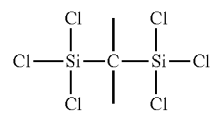

1,1,1,3,3,3-hexachloro-2,2-dimethyl-1,3-disilapropane

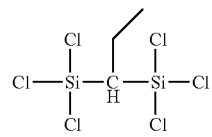

1,1,1,3,3,3-hexachloro-2-ethyl-1,3-disilapropane

TABLE 2

Silicon precursors having two Si—C—Si linkages

1-chloro-1,3-disilacyclobutane

TABLE 2-continued

Silicon precursors having two Si—C—Si linkages

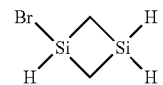

1-bromo-1,3-disilacyclobutane

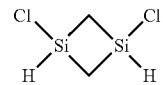

1,3-dichloro-1,3-disilacyclobutane

1,3-dibromo-1,3-disilacyclobutane

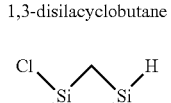

1,1-dichloro-1,3-disilacyclobutane

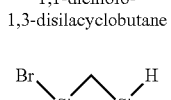

1,1-dibromo-1,3-disilacyclobutane

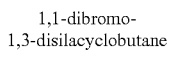

1,1,3-trichloro-1,3-disilacyclobutane

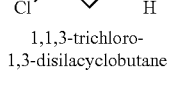

1,1,3-tribromo-1,3-disilacyclobutane

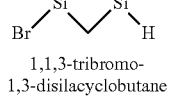

1,1,3,3-tetrachloro-1,3-disilacyclobutane

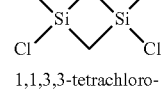

1,1,3,3-tetrabromo-1,3-disilacyclobutane

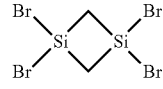

1,3-dichloro-1,3-dimethyl-1,3-disilacyclobutane

1,3-bromo-1,3-dimethyl-1,3-disilacyclobutane

1,1,1,3,3,5,5,5-octachloro-1,3,5-trisilapentane

1,1,3,3,5,5-hexachloro-1,5-dimethyl-1,3,5-trisilapentane

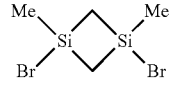

1,1,1,5,5,5-hexachloro-3,3-dimethyl-trisilapentane

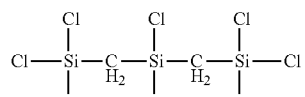

1,1,3,5,5-pentachloro-1,3,5-trimethyl-1,3,5-trisilapentane

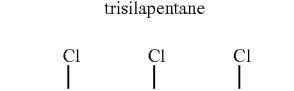

1,1,1,5,5,5-hexachloro-1,3,5-trisilapentane

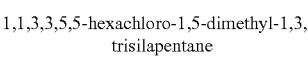

1,1,5,5-tetrachloro-1,3,5-trisilapentane

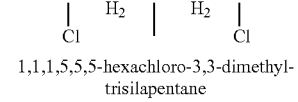

1-iodo-1,3-disilacyclobutane

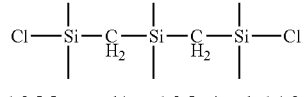

1,1-diiodo-1,3-disilacyclobutane

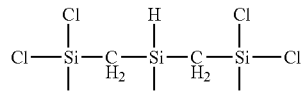

1,3-diiodo-1,3-disilacyclobutane

TABLE 2-continued

Silicon precursors having two Si—C—Si linkages

1,1,3-triiodo-1,3-disilacyclobutane

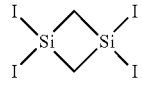

1,1,3,3-tetraiodo-1,3-disilacyclobutane

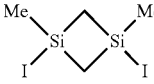

1,3-diiodo-1,3-dimethyl-
1,3-disilacyclobutane and in at least one aspect of the invention, (b) optionally at least one solvent. In certain embodiments of the composition described herein, exemplary solvents can include, without limitation, ether, tertiary amine, alkyl hydrocarbon, aromatic hydrocarbon, tertiary aminoether, siloxanes, and combinations thereof. In certain embodiments, the difference between the boiling point of the compound having one Si—C—Si or two Si—C—Si linkages and the boiling point of the solvent is 40° C. or less. The wt % of silicon precursor compound in the solvent can vary from 1 to 99 wt %, or 10 to 90 wt %, or 20 to 80 wt %, or 30 to 70 wt %, or 40 to 60 wt %, to 50 to 50 wt %. In some embodiments, the composition can be delivered via direct liquid injection into a reactor chamber for silicon-containing film using conventional direct liquid injection equipment and methods.

In one embodiment of the method described herein, a silicon nitride or carbon-doped silicon nitride film having a carbon content less than 5 at. % or less is deposited using a plasma enhanced ALD process. In this embodiment, the method comprises:
 a. placing one or more substrates comprising a surface feature into a reactor
 b. heating the reactor to one or more temperatures ranging from ambient temperature to about 600° C. and optionally maintaining the reactor at a pressure of 100 torr or less;
 c. introducing into the reactor at least one silicon precursor having one Si—C—Si linkage selected from the group consisting of 1,1,1,3,3,3-hexachloro-1,3-disilapropane, 1,1,1,3,3,3-hexachloro-2-methyl-1,3-disilapropane, 1,1,1,3,3,3-hexachloro-2,2-dimethyl-1,3-disilapropane, and 1,1,1,3,3,3-hexachloro-2-ethyl-1,3-disilapropane;
 d. purging with an inert gas thereby removing any unreacted silicon precursor and forming a composition comprising the purge gas and silicon precursor;
 e. providing a plasma including/comprising ammonia source into the reactor to react with the surface to form a silicon nitride or carbon-doped silicon nitride film;
 f. purging with inert gas to remove any reaction by-products;
 g. repeating steps c to f to provide a desired thickness of the silicon nitride or carbon-doped silicon nitride film;
 h. optionally post-deposition treating the silicon nitride or carbon-doped silicon nitride film with a thermal anneal or a spike anneal at temperatures from 400 to 1000 C or a UV light source; wherein the UV exposure step can be carried out either during film deposition, or once deposition has been completed;
 i. optionally post-deposition exposing the silicon nitride or carbon-doped silicon nitride film to a plasma comprising hydrogen or inert gas or nitrogen to improve at least one of the film's physical properties.

In another embodiment of the method described herein, a silicon nitride or carbon-doped silicon nitride film having a carbon content less than 5 at. % or less is deposited using a plasma enhanced ALD process. In this embodiment, the method comprises:
 a. placing one or more substrates comprising a surface feature into a reactor
 b. heating the reactor to one or more temperatures ranging from ambient temperature to about 600° C. and optionally maintaining the reactor at a pressure of 100 torr or less;
 c. introducing into the reactor at least one silicon precursor having one Si—C—Si linkage or two Si—C—Si linkages selected from the group consisting of 1,1,1,3,3,3-hexachloro-1,3-disilapropane, 1,1,1,3,3,3-hexachloro-2-methyl-1,3-disilapropane, 1,1,1,3,3,3-hexachloro-2,2-dimethyl-1,3-disilapropane, 1,1,1,3,3,3-hexachloro-2-ethyl-1,3-disilapropane, 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,3,3,5,5-hexachloro-1,5-dimethyl-1,3,5-trisilapentane, 1,1,1,5,5,5-hexachloro-3,3-dimethyl-1,3,5-trisilapentane, 1,1,3,5,5-pentachloro-1,3,5-trimethyl-1,3,5-trisilapentane, 1,1,1,5,5,5-hexachloro-1,3,5-trisilapentane, 1,1,5,5-tetrachloro-1,3,5-trisilapentane, 1-iodo-1,3-disilacyclobutane, 1,1-diiodo-1,3-disilacyclobutane, 1,3-diiodo-1,3-disilacyclobutane, 1,1,3-triiodo-1,3-disilacyclobutane, 1,1,3,3-tetraiodo-1,3-disilacyclobutane, and 1,3-diiodo-1,3-dimethyl-1,3-disilacyclobutane;
 d. purging with an inert gas thereby removing any unreacted silicon precursor and forming a composition comprising the purge gas and silicon precursor;
 e. providing a plasma including/comprising ammonia source into the reactor to react with the surface to form a silicon nitride or carbon-doped silicon nitride film;
 f. purging with inert gas to remove any reaction by-products;
 g. repeating steps c to f to provide a desired thickness of the silicon nitride or carbon-doped silicon nitride film.

In another embodiment of the method described herein, a silicon nitride or carbon-doped silicon nitride film having a carbon content of 5 at. % or less is deposited using a plasma enhanced ALD process. In this embodiment, the method comprises:
 a. placing one or more substrates comprising a surface feature into a reactor (e.g., into a conventional ALD reactor);
 b. heating the reactor to one or more temperatures ranging from ambient temperature to about 600° C. and optionally maintaining the reactor at a pressure of 100 torr or less;

c. introducing into the reactor at least one silicon precursor having two Si—C—Si linkages selected from the group consisting of 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,3,3,5,5-hexachloro-1,5-dimethyl-1,3,5-trisilapentane, 1,1,1,5,5,5-hexachloro-3,3-dimethyl-1,3,5-trisilapentane, 1,1,3,5,5-pentachloro-1,3,5-trimethyl-1,3,5-trisilapentane, 1,1,1,5,5,5-hexachloro-1,3,5-trisilapentane, 1,1,5,5-tetrachloro-1,3,5-trisilapentane, 1-iodo-1,3-disilacyclobutane, 1,1-diiodo-1,3-disilacyclobutane, 1,3-diiodo-1,3-disilacyclobutane, 1,1,3-triiodo-1,3-disilacyclobutane, 1,1,3,3-tetraiodo-1,3-disilacyclobutane, and 1,3-diiodo-1,3-dimethyl-1,3-disilacyclobutane;
d. purging with an inert gas;
e. providing a plasma including/comprising an ammonia source into the reactor to react with the surface to form a silicon nitride or carbon-doped silicon nitride film;
f. purging with inert gas to remove reaction by-products;
g. repeating steps c to f to provide a desired thickness of the silicon nitride or carbon-doped silicon nitride film;
h. optionally post-deposition treating the silicon nitride or carbon-doped silicon nitride film with a spike anneal at temperatures from 400 to 1000 C or a UV light source; wherein the UV exposure step can be carried out either during film deposition, or once deposition has been completed;
i. optionally post-deposition exposing the silicon nitride or carbon-doped silicon nitride film to a plasma comprising hydrogen or inert gas or nitrogen to improve at least one of the film's physical properties.

In another embodiment of the method described herein, a carbon-doped silicon oxynitride film having a carbon content of 5 at. % or less is deposited using a plasma enhanced ALD process. In this embodiment, the method comprises:
a. placing one or more substrates comprising a surface feature into a reactor (e.g., into a conventional ALD reactor);
b. heating the reactor to one or more temperatures ranging from ambient temperature to about 600° C. and optionally maintaining the reactor at a pressure of 100 torr or less;
c. introducing into the reactor at least one silicon precursor having two Si—C—Si linkages selected from the group consisting of 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,3,3,5,5-hexachloro-1,5-dimethyl-1,3,5-trisilapentane, 1,1,1,5,5,5-hexachloro-3,3-dimethyl-1,3,5-trisilapentane, 1,1,3,5,5-pentachloro-1,3,5-trimethyl-1,3,5-trisilapentane, 1,1,1,5,5,5-hexachloro-1,3,5-trisilapentane, 1,1,5,5-tetrachloro-1,3,5-trisilapentane, 1-iodo-1,3-disilacyclobutane, 1,1-diiodo-1,3-disilacyclobutane, 1,3-diiodo-1,3-disilacyclobutane, 1,1,3-triiodo-1,3-disilacyclobutane, 1,1,3,3-tetraiodo-1,3-disilacyclobutane, and 1,3-diiodo-1,3-dimethyl-1,3-disilacyclobutane;
d. purging with an inert gas;
e. providing a plasma including/comprising ammonia source into the reactor to react with the surface to form a silicon nitride or carbon-doped silicon nitride film;
f. purging with inert gas to remove reaction by-products;
g. repeating steps c to f to provide a desired thickness of the silicon nitride or carbon-doped silicon nitride film;
h. post-deposition treating the silicon nitride or carbon-doped silicon nitride film with an oxygen source at one or more temperatures ranging from about ambient temperature to 1000° C. or from about 100° to 400° C. to convert the silicon nitride or carbon-doped silicon nitride film into a silicon oxynitride or carbon-doped silicon oxynitride film either in situ or in another chamber.

In yet another embodiment of the method described herein, the silicon nitride or carbon-doped silicon nitride film having a carbon content less than 5 at. % is deposited using a plasma enhanced ALD process. In this embodiment, the method comprises:
a. placing one or more substrates comprising a surface feature into a reactor
b. heating the reactor to one or more temperatures ranging from ambient temperature to about 600° C. and optionally maintaining the reactor at a pressure of 100 torr or less;
c. introducing into the reactor at least one silicon precursor having one Si—C—Si linkage selected from the group consisting of 1,1,1,3,3,3-hexachloro-1,3-disilapropane, 1,1,1,3,3,3-hexachloro-2-methyl-1,3-disilapropane, 1,1,1,3,3,3-hexachloro-2,2-dimethyl-1,3-disilapropane, and 1,1,1,3,3,3-hexachloro-2-ethyl-1,3-disilapropane;
d. purging with an inert gas thereby removing any unreacted silicon precursor and forming a composition comprising the purge gas and silicon precursor;
e. providing a first plasma including/comprising ammonia source into the reactor to react with the surface to form a silicon nitride or carbon-doped silicon nitride film;
f. purging with inert gas to remove any reaction by-products;
g. providing a second plasma including/comprising nitrogen source into the reactor to react with the surface to form a silicon nitride or carbon-doped silicon nitride film;
h. purging with inert gas to remove any reaction by-products; and
i. repeating steps c to h to provide a desired thickness of the silicon nitride or carbon-doped silicon nitride film.

In yet another embodiment of the method described herein, the silicon nitride or carbon-doped silicon nitride film has a carbon content less than 5 at. % or less and deposited using a plasma enhanced ALD process. In this embodiment, the method comprises:
a. placing one or more substrates comprising a surface feature into a reactor
b. heating the reactor to one or more temperatures ranging from ambient temperature to about 600° C. and optionally maintaining the reactor at a pressure of 100 torr or less;
c. introducing into the reactor at least one silicon precursor having two Si—C—Si linkages selected from the group consisting of 1-chloro-1,3-disilacyclobutane, 1-bromo-1,3-disilacyclobutane, 1,3-dichloro-1,3-1,3- disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,3,3,5,5-hexachloro-1,5-dimethyl-1,3,5-trisilapentane, 1,1,1,5,5,5-hexachloro-3,3-dimethyl-1,3,5-trisilapentane, 1,1,3,5,5-pentachloro-1,3,5-trimethyl-1,3,5-trisilapentane, 1,1,1,5,5,5-hexachloro-1,3,5-trisilapentane, 1,1,5,5-tetrachloro-1,3,5-trisilapentane, 1-iodo-1,3-disilacyclobutane, 1,1-diiodo-1,3-disilacyclobutane, 1,3-diiodo-1,3-disilacyclobutane, 1,1,3-triiodo-1,3-disilacyclobutane, 1,1,3,3-tetraiodo-1,3-disilacyclobutane, and 1,3-diiodo-1,3-dimethyl-1,3-disilacyclobutane;

d. purging with an inert gas thereby removing any unreacted silicon precursor and forming a composition comprising the purge gas and silicon precursor;

e. providing a first plasma including/comprising nitrogen source into the reactor to react with the surface to form a silicon nitride or carbon-doped silicon nitride film;

f. purging with inert gas to remove any reaction by-products;

g. providing a second plasma including/comprising ammonia source into the reactor to react with the surface to form a silicon nitride or carbon-doped silicon nitride film;

h. purging with inert gas to remove any reaction by-products; and i. repeating steps c to h to provide a desired thickness of the silicon nitride or carbon-doped silicon nitride film.

In one embodiment, the substrate includes at least one feature wherein the feature comprises a pattern trench with aspect ratio of 1:9 or more, opening of 180 nm or less.

In certain embodiments, the temperature of the reactor in the introducing step is at one or more temperatures ranging from about room temperature (e.g., 20° C.) to about 600° C. Alternative ranges for the substrate temperature have one or more of the following end points: 20, 50, 75, 100, 125, 150, 175, 200, 225, 250, 275, 300, 325, 350, 375, 400, 425, 450, 475, and 500° C. Exemplary temperature ranges include the following: 20 to 300° C., 100 to 300° C. or 100 to 350° C.

In yet another embodiment, a vessel for depositing a silicon-containing film includes one or more silicon precursor compounds described herein. In one particular embodiment, the vessel is at least one pressurizable vessel (preferably of stainless steel having a design such as disclosed in U.S. Pat. Nos. 7,334,595; 6,077,356; 5,069,244; and 5,465,766 the disclosure of which is hereby incorporated by reference. The container can comprise either glass (borosilicate or quartz glass) or type 316, 316L, 304 or 304L stainless steel alloys (UNS designation S31600, S31603, S30400 S30403) fitted with the proper valves and fittings to allow the delivery of one or more precursors to the reactor for a CVD or an ALD process. In this or other embodiments, the silicon precursor is provided in a pressurizable vessel comprised of stainless steel and the purity of the precursor is 98% by weight or greater or 99.5% or greater which is suitable for the semiconductor applications. The silicon precursor compounds are preferably substantially free of metal ions such as, $Al^{3+}$, $Fe^{2+}$, $Fe^{3+}$, $Ni^{2+}$, $Cr^{3+}$ ions. As used herein, the term "substantially free" as it relates to $Al^{3+}$, $Fe^{2+}$, $Fe^{3+}$, $Ni^{2+}$, $Cr^{3+}$ ions means less than about 5 ppm (by weight), preferably less than about 3 ppm, and more preferably less than about 1 ppm, and most preferably about 0.1 ppm; the term "substantially free" as it relates to Al, Fe, Ni, Cr means less than 5 ppm (by weight), preferably less than 3 ppm, and more preferably less than 1 ppm, and most preferably 0.1 ppm as measured by ICP-MS. In certain embodiments, such vessels can also have means for mixing the precursors with one or more additional precursor if desired. In these or other embodiments, the contents of the vessel(s) can be premixed with an additional precursor. Alternatively, the silicon precursor is and/or other precursor can be maintained in separate vessels or in a single vessel having separation means for maintaining the silicon precursor is and other precursor separate during storage.

The silicon-containing film is deposited upon at least a surface of a substrate such as a semiconductor substrate. In the method described herein, the substrate may be comprised of and/or coated with a variety of materials well known in the art including films of silicon such as crystalline silicon or amorphous silicon, silicon oxide, silicon nitride, amorphous carbon, silicon oxycarbide, silicon oxynitride, silicon carbide, germanium, germanium doped silicon, boron doped silicon, metal such as copper, tungsten, aluminum, cobalt, nickel, tantalum), metal nitride such as titanium nitride, tantalum nitride, metal oxide, group III/V metals or metalloids such as GaAs, InP, GaP and GaN, and a combination thereof. These coatings may completely coat the semiconductor substrate, may be in multiple layers of various materials and may be partially etched to expose underlying layers of material. The surface may also have on it a photoresist material that has been exposed with a pattern and developed to partially coat the substrate. In certain embodiments, the semiconductor substrate comprising at least one surface feature selected from the group consisting of pores, vias, trenches, and combinations thereof. The potential application of the silicon-containing films includes but not limited to low k spacer for FinFET or nanosheet, sacrificial hard mask for self-aligned patterning process (such as SADP, SAQP, or SAOP).

The deposition method used to form the silicon-containing films or coatings are deposition processes. Examples of suitable deposition processes for the method disclosed herein include, but are not limited to, a chemical vapor deposition or an atomic layer deposition process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator.

In one embodiment, the silicon-containing film is deposited using an ALD process. In another embodiment, the silicon-containing film is deposited using a cyclic CVD (CCVD) process. In a further embodiment, the silicon-containing film is deposited using a thermal ALD process. The term "reactor" as used herein, includes without limitation, reaction chamber or deposition chamber.

In certain embodiments, the method disclosed herein avoids pre-reaction of precursor(s) by using ALD or cyclic CVD methods that separate the precursor(s) prior to and/or during the introduction to the reactor. In this connection, deposition techniques such as ALD or CCVD processes are used to deposit the silicon-containing film. In one embodiment, the film is deposited via an ALD process in a typical single wafer ALD reactor, semi-batch ALD reactor, or batch furnace ALD reactor by exposing the substrate surface alternatively to the one or more the silicon-containing precursor, oxygen source, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases. In another embodiment, each reactant including the silicon precursor and reactive gas is exposed to a substrate by moving or rotating the substrate to different sections of the reactor and each section is separated by inert gas curtain, i.e. spatial ALD reactor or roll to roll ALD reactor.

Depending upon the deposition method, in certain embodiments, the silicon precursors described herein and optionally other silicon-containing precursors may be introduced into the reactor at a predetermined molar volume, or from about 0.1 to about 1000 micromoles. In this or other embodiments, the precursor may be introduced into the reactor for a predetermined time period. In certain embodiments, the time period ranges from about 0.001 to about 500 seconds.

In certain embodiments, the silicon nitride or carbon-doped silicon films deposited using the methods described herein are treated with an oxygen source, reagent or precursor comprising oxygen, i.e. water vapors to convert into carbon-doped oxynitride. An oxygen source may be introduced into the reactor in the form of at least one oxygen source and/or may be present incidentally in the other precursors used in the deposition process. Suitable oxygen source gases may include, for example, air, water ($H_2O$) (e.g., deionized water, purified water, distilled water, water vapor, water vapor plasma, hydrogen peroxide, oxygenated water, air, a composition comprising water and other organic liquid), oxygen ($O_2$), oxygen plasma, ozone ($O_3$), nitric oxide (NO), nitrogen dioxide ($NO_2$), nitrous oxide ($N_2O$), carbon monoxide (CO), hydrogen peroxide ($H_2O_2$), a plasma comprising water, a plasma comprising water and argon, hydrogen peroxide, a composition comprising hydrogen, a composition comprising hydrogen and oxygen, carbon dioxide ($CO_2$), air, and combinations thereof. In certain embodiments, the oxygen source comprises an oxygen source gas that is introduced into the reactor at a flow rate ranging from about 1 to about 10000 square cubic centimeters (sccm) or from about 1 to about 1000 sccm. The oxygen source can be introduced for a time that ranges from about 0.1 to about 100 seconds. The catalyst is selected from a Lewis base such as pyridine, piperazine, trimethylamine, tert-butylamine, diethylamine, trimethylamine, ethylenediamine, ammonia, or other organic amines.

In embodiments wherein the film is deposited by an ALD or a cyclic CVD process, the precursor pulse can have a pulse duration that is greater than 0.01 seconds, and the oxygen source can have a pulse duration that is less than 0.01 seconds, while the water pulse duration can have a pulse duration that is less than 0.01 seconds.

In certain embodiments, the oxygen source is continuously flowing into the reactor while precursor pulse and plasma are introduced in sequence. The precursor pulse can have a pulse duration greater than 0.01 seconds while the plasma duration can range between 0.01 seconds to 100 seconds.

In certain embodiments, the silicon-containing films comprise silicon and nitrogen. In these embodiments, the silicon-containing films deposited using the methods described herein are formed in the presence of nitrogen-containing source. A nitrogen-containing source may be introduced into the reactor in the form of at least one nitrogen source and/or may be present incidentally in the other precursors used in the deposition process.

Suitable ammonia-containing gases may include, for example, ammonia, a mixture of ammonia and inert gas, a mixture of ammonia and nitrogen, a mixture of ammonia and hydrogen, and combination thereof.

In certain embodiments, the nitrogen source is introduced into the reactor at a flow rate ranging from about 1 to about 10000 square cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process using both a nitrogen and oxygen source, the precursor pulse can have a pulse duration that is greater than 0.01 seconds, and the nitrogen source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

The deposition methods disclosed herein include one or more steps of purging unwanted or unreacted material from a reactor using purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon (Ne), hydrogen ($H_2$), and combinations thereof. In certain embodiments, a purge gas such as Ar is supplied into the reactor at a flow rate ranging from about 10 to about 10000 sccm for about 0.1 to 1000 seconds, thereby purging the unreacted material and any byproduct that may remain in the reactor.

The respective steps of supplying the precursors, oxygen source, the ammonia-containing source, and/or other precursors, source gases, and/or reagents may be performed by changing the time for supplying them to change the stoichiometric composition of the resulting film.

Energy is applied to the at least one of the precursor, ammonia-containing source, reducing agent such as hydrogen plasma, other precursors or combination thereof to induce reaction and to form the film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof.

In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The silicon precursors and/or other silicon-containing precursors may be delivered to the reaction chamber, such as a CVD or ALD reactor, in a variety of ways.

In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In this or other embodiments, it is understood that the steps of the methods described herein may be performed in a variety of orders, may be performed sequentially or concurrently (e.g., during at least a portion of another step), and any combination thereof. The respective step of supplying the precursors and the nitrogen-containing source gases may be performed by varying the duration of the time for supplying them to change the stoichiometric composition of the resulting silicon-containing film.

In a still further embodiment of the methods described herein, the film or the as-deposited film is subjected to a treatment step. The treatment step can be conducted during at least a portion of the deposition step, after the deposition step, and combinations thereof. Exemplary treatment steps include, without limitation, treatment via high temperature thermal annealing; plasma treatment; ultraviolet (UV) light treatment; laser; electron beam treatment and combinations thereof to affect one or more properties of the film. The films deposited with the silicon precursors having one or two Si—C—Si linkages described herein, when compared to films deposited with previously disclosed silicon precursors under the same conditions, have improved properties such as, without limitation, a wet etch rate that is lower than the wet etch rate of the film before the treatment step or a density that is higher than the density prior to the treatment step. In one particular embodiment, during the deposition process, as-deposited films are intermittently treated. These intermittent or mid-deposition treatments can be performed, for example, after each ALD cycle, after a certain number of ALD, such as, without limitation, one (1) ALD cycle, two (2) ALD cycles, five (5) ALD cycles, or after every ten (10) or more ALD cycles.

In an embodiment wherein the film is treated with a high temperature annealing step, the annealing temperature is at least 100° C. or greater than the deposition temperature. In this or other embodiments, the annealing temperature ranges from about 400° C. to about 1000° C. In this or other embodiments, the annealing treatment can be conducted in a vacuum (<760 Torr), inert environment or in oxygen containing environment (such as ozone, $H_2O$, $H_2O_2$, $N_2O$, $NO_2$ or $O_2$)

In an embodiment wherein the film is treated to UV treatment, film is exposed to broad band UV or, alternatively, an UV source having a wavelength ranging from about 150 nanometers (nm) to about 400 nm. In one particular embodiment, the as-deposited film is exposed to UV in a different chamber than the deposition chamber after a desired film thickness is reached.

In an embodiment where in the film is treated with a plasma, passivation layer such as carbon-doped silicon oxide is deposited to prevent chlorine and nitrogen contamination from penetrating film in the subsequent plasma treatment. The passivation layer can be deposited using atomic layer deposition or cyclic chemical vapor deposition.

In an embodiment wherein the film is treated with a plasma, the plasma source is selected from the group consisting of hydrogen plasma, plasma comprising hydrogen and helium, plasma comprising hydrogen and argon. Hydrogen plasma lowers film dielectric constant and boost the damage resistance to following plasma ashing process while still keeping the carbon content in the bulk almost unchanged.

The following examples illustrate certain aspects of the instant invention and do not limit the scope of the appended claims.

EXAMPLES

In the following examples, unless stated otherwise, properties will be obtained from sample films that are deposited onto silicon wafer with resistivity of 5-20 Ω-cm as substrate. All film depositions are performed using the CN-1 reactor, which has a showerhead design with 13.56 MHz direct plasma.

In typical process conditions, unless stated otherwise, the chamber pressure is fixed at a pressure ranging from about 1 to about 5 Torr. Additional inert gas is used to maintain chamber pressure.

The film depositions comprise the steps listed in Tables 3 and 4 for thermal ALD and plasma enhanced ALD ("PEALD"). Steps a through d in Table 3 constitute one PEALD cycle and are repeated. Steps a through f in Table 4 or 5 constitute one PEALD cycle and are repeated. Unless otherwise specified, a total of 100 or 200 or 300 or 500 times to get the desired film thickness.

TABLE 3

Deposition Steps in ALD Silicon Nitride Films

| Step | |
|---|---|
| a | Introduce vapors of a silicon precursor to the reactor; additional inert gas is used to maintain chamber pressure to provide a chemisorbed layer |
| b | Purge unreacted silicon precursor from the reactor chamber with inert gas |
| c | Introduce a plasma comprising an ammonia source to react with the surface of the chemisorbed layer and create reactive sites |
| d | Purge reaction by-products out |

TABLE 4

Deposition Steps in ALD Silicon Nitride Films

| Step | |
|---|---|
| a | Introduce vapors of a silicon precursor to the reactor; additional inert gas is used to maintain chamber pressure to provide a chemisorbed layer |
| b | Purge unreacted silicon precursor from the reactor chamber with inert gas |
| c | Introduce a first plasma comprising an ammonia source to react with the surface of the chemisorbed layer and create reactive sites |
| d | Purge reaction by-products out |
| e | Introduce a second plasma comprising a nitrogen source to react with the surface of the chemisorbed layer and create reactive sites |
| f | Purge reaction by-products out |

TABLE 5

Deposition Steps in ALD Silicon Nitride Films

| Step | |
|---|---|
| a | Introduce vapors of a silicon precursor to the reactor; additional inert gas is used to maintain chamber pressure to provide a chemisorbed layer |

TABLE 5-continued

Deposition Steps in ALD Silicon Nitride Films

| Step | |
|---|---|
| b | Purge unreacted silicon precursor from the reactor chamber with inert gas |
| c | Introduce a first plasma comprising a nitrogen source to react with the surface of the chemisorbed layer and create reactive sites |
| d | Purge reaction by-products out |
| e | Introduce a second plasma comprising an ammonia source to react with the surface of the chemisorbed layer and create reactive sites |
| f | Purge reaction by-products out |

The refractive index (RI) and thickness for the deposited films are measured using an ellipsometer. Film non-uniformity is calculated using the standard equation: % non-uniformity=((max thickness−min thickness)/(2*average (avg) thickness)). Film structure and composition are analyzed using Fourier Transform Infrared (FTIR) spectroscopy and X-Ray Photoelectron Spectroscopy (XPS). The density for the films is measured with X-ray Reflectometry (XRR).

Example 1: ALD Silicon Nitride Using 1,1,3,3-tetrachloro-1,3-disilacyclobutane and NH$_3$/Argon Plasma A silicon wafer was loaded into a CN-1 reactor equipped with showerhead design with 13.56 MHz direct plasma and heated to 300° C. with chamber pressure of 1 torr. 1,1,3,3-tetrachloro-1,3-disilacyclobutane as a silicon precursor, was delivered as vapor into the reactor using bubbling or vapor draw.

The ALD cycle was comprised of the process steps provided in Table 3 except steps e and f; and used the following process parameters:
a. Introduce vapors of 1,1,3,3-tetrachloro-1,3-disilacyclobutane into the reactor
   Argon flow: 100 sccm through precursor container
   Pulse: 2 seconds
   Ar flow: 1000 sccm
b. Purge
   Argon flow: 1000 sccm
   Purge time: 10 seconds
c. Introduce ammonia plasma
   Argon flow: 1000 sccm
   Ammonia flow: 100 sccm
   Plasma power: 300 W
   Pulse: 10 seconds
d. Purge
   Argon flow: 1000 sccm
   Purge time: 5 seconds
Steps a to d were repeated for 250 cycles to provide 30 nm of silicon nitride with a composition of 58.0 at. % nitrogen, 39.7 at % silicon, 2.3 at. % oxygen, and 0.12 at. % chlorine. Carbon was undetectable. The as-deposited silicon nitride does not change when exposure to ambient air for over 24 hours, suggesting it is a stable film.

Example 2: ALD Silicon Nitride Using 1,1,3,3-tetrachloro-1,3-disilacyclobutane and NH$_3$/Argon Plasma A silicon wafer was loaded into the CN-1 reactor equipped with a showerhead design with 13.56 MHz direct plasma and heated to 300° C. with a chamber pressure of 1 torr. 1,1,3,3-tetrachloro-1,3-disilacyclobutane was delivered as vapor into the reactor using bubbling. The ALD cycle was comprised of the process steps provided in Table 3 except steps e and f; and used the following process parameters:
a. Introduce vapor of 1,1,3,3-tetrachloro-1,3-disilacyclobutane into the reactor
   Argon flow: 100 sccm through precursor container
   Pulse: 2 seconds
   Argon: 1000 sccm
b. Inert gas purge
   Argon flow: 1000 sccm
   Purge time: 10 seconds
c. Introduce ammonia plasma
   Argon flow: 1000 sccm
   Ammonia flow: 25 sccm
   Plasma power: 300 W
   Pulse: 10 seconds
d. Purge
   Argon flow: 1000 sccm
   Purge time: 5 seconds
Steps a to d were repeated for 250 cycles to provide 30 nm of silicon nitride with a composition of 58.0 at. % nitrogen, 39.6 at. % silicon, 2.2 at. % oxygen, and 0.27 at. % chlorine. Carbon was undetectable, Example 3: ALD Silicon Nitride Using 1,1,3,3-tetrachloro-1,3-disilacyclobutane, NH$_3$/Argon Plasma, and Nitrogen/Ar Plasma A silicon wafer was loaded into the CN-1 reactor equipped with a showerhead design with 13.56 MHz direct plasma and heated to 300° C. with a chamber pressure of 1 torr. 1,1,3,3-tetrachloro-1,3-disilacyclobutane was delivered as vapor into the reactor using bubbling. The ALD cycle was comprised of the process steps provided in Table 4 and used the following process parameters:
a. Introduce vapor of 1,1,3,3-tetrachloro-1,3-disilacyclobutane into the reactor
   Argon flow: 100 sccm through precursor container
   Pulse: 2 seconds
   Argon: 1000 sccm
b. Inert gas purge
   Argon flow: 1000 sccm
   Purge time: 20 seconds
c. Introduce ammonia plasma
   Argon flow: 1000 sccm
   Ammonia flow: 50 sccm
   Plasma power: 100 W
   Pulse: 10 seconds
d. Purge
   Argon flow: 1000 sccm
   Purge time: 5 seconds
e. Introduce nitrogen plasma
   Argon flow: 1000 sccm
   Nitrogen flow: 500 sccm
   Plasma power: 100 W
   Pulse: 5 seconds
f. Purge
   Argon flow: 1000 sccm
   Purge time: 5 seconds
Steps a to f were repeated for 400 cycles to provide 24 nm of silicon nitride with a composition of 40.76 at. % nitrogen, 37.04 at. % silicon, 0.23 at. % oxygen, and 0.17 at. % chlorine, carbon 0.28 at. %. Density is 2.73 g/cm$^3$.

Example 4: ALD Silicon Nitride Using 1,1,3,3-tetrachloro-1,3-disilacyclobutane, Nitrogen/Ar Plasma, and NH$_3$/Argon Plasma A silicon wafer was loaded into the CN-1 reactor equipped with a showerhead design with 13.56 MHz direct plasma and heated to 300° C. with a chamber pressure of 1 torr. 1,1,3,3-tetrachloro-1,3-disilacyclobutane was delivered as vapor into the reactor using bubbling. The ALD cycle was comprised of the process steps provided in Table 5 and used the following process parameters:

a. Introduce vapor of 1,1,3,3-tetrachloro-1,3-disilacyclobutane into the reactor
   Argon flow: 100 sccm through precursor container
   Pulse: 2 seconds
   Argon: 1000 sccm
b. Inert gas purge
   Argon flow: 1000 sccm
   Purge time: 30 seconds
c. Introduce nitrogen plasma
   Argon flow: 1000 sccm
   Nitrogen flow: 500 sccm
   Plasma power: 100 W
   Pulse: 5 seconds
d. Purge
   Argon flow: 1000 sccm
   Purge time: 5 seconds
e. Introduce ammonia plasma
   Argon flow: 1000 sccm
   Ammonia flow: 50 sccm
   Plasma power: 100 W
   Pulse: 10 seconds
f. Purge
   Argon flow: 1000 sccm
   Purge time: 5 seconds Steps a to f were repeated for 400 cycles to provide 40 nm of silicon nitride with a composition of 58.78 at. % nitrogen, 38.30 at. % silicon, 2.43 at. % oxygen, and 0.50 at. % chlorine, carbon 0.28 at. %. Density is 2.75 g/cm$^3$.

Although illustrated and described above with reference to certain specific embodiments and working examples, the present invention is nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges which fall within the broader ranges.

The following is claimed:

1. A method for forming a silicon and nitrogen containing film having a dielectric constant (k) of about 7 or less, an oxygen content of about 5 at. % or less and a carbon content less than 5 at. % via a plasma enhanced ALD process, the method comprising:
   a) providing a substrate comprising a surface feature in a reactor;
   b) heating the reactor to one or more temperatures ranging up to about 600° C. and optionally, maintaining the reactor at a pressure of 100 torr or less;
   c) introducing into the reactor at least one silicon precursor having two Si—C—Si linkages and selected from a group consisting of 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,3,3,5,5-octachloro-1,3,5-trisilapentane, 1,1,3,3,5,5-hexachloro-1,5-dimethyl-1,3,5-trisilapentane, 1,1,5,5-hexachloro-3,3-dimethyl-1,3,5-trisilapentane, 1,1,3,5,5-pentachloro-1,3,5-trimethyl-1,3,5-trisilapentane, 1,1,1,5,5,5-hexachloro-1,3,5-trisilapentane, 1,1,5,5-tetrachloro-1,3,5-trisilapentane, 1-iodo-1,3-disilacyclobutane, 1,1-diiodo-1,3-disilacyclobutane, 1,3-diiodo-1,3-disilacyclobutane, 1,1,3-triiodo-1,3-disilacyclobutane, 1,1,3,3-tetraiodo-1,3-disilacyclobutane, and 1,3-diiodo-1,3-dimethyl-1,3-disilacyclobutane to form a silicon-containing species on the substrate;
   d) purging the reactor of any unreacted silicon precursors and/or any reaction by-products from step c, using a first inert gas;
   e) providing a plasma comprising an ammonia source into the reactor to react with the silicon-containing species to form a silicon nitride film;
   f) purging the reactor of any further reaction by-products from step e with a second inert gas; and
   g) repeating steps c to f as necessary to bring the silicon nitride film to a predetermined thickness.

2. The method according to claim 1, further comprising: treating the silicon nitride film with a spike anneal at a temperature ranging between 400 and 1000° C.

3. The method according to claim 1, further comprising: exposing the silicon nitride film to a UV light source either during or after deposition of the silicon nitride film.

4. The method according to claim 1, further comprising: exposing the silicon nitride film to a plasma comprising hydrogen or inert gas or nitrogen.

5. The method of claim 1 further comprising performing a thermal anneal on the silicon nitride film at temperatures from 300° C. to 1000° C.

6. The method of claim 1 further comprising performing a plasma treatment on the silicon nitride film with an inert gas plasma or hydrogen/inert plasma or nitrogen plasma at a temperature ranging between 25° C. and 600° C.

7. The method of claim 1 further comprising:
   h) providing a plasma comprising a nitrogen source into the reactor to react with the silicon-containing species and further form the silicon nitride film; and
   i) purging the reactor of any further reaction by-products with a second inert gas, wherein the step g) of repeating steps c to f also includes repeating steps h and i such that steps c to i repeated as necessary to bring the silicon nitride film to a predetermined thickness.

8. A film formed according to the method of claim 7, the film having a density of about 2.7 g/cm$^3$ or higher.

9. The method according to claim 1, wherein the silicon nitride film is a carbon-doped silicon nitride film.

10. The method of claim 9 further comprising performing a thermal anneal on the carbon doped silicon nitride film at temperatures from 300° C. to 1000° C.

11. The method of claim 9 further comprising performing a plasma treatment on the carbon-doped silicon nitride film with an inert gas plasma or hydrogen/inert plasma or nitrogen plasma at a temperature ranging between 25° C. and 600° C.

12. The film according to claim 1 having a carbon content of about 3 atomic weight percent or less as measured by X-ray photoelectron spectroscopy.

13. The film according to claim 12 having a carbon content of about 2 atomic weight percent or less as measured by X-ray photoelectron spectroscopy.

14. The film according to claim 13 having a carbon content of about 1 atomic weight percent or less as measured by X-ray photoelectron spectroscopy.

15. The method according to claim 1, further comprising:
   treating the silicon nitride film with an oxygen source at one or more temperatures ranging from ambient temperature to 1000° C. to convert the silicon nitride into a silicon oxynitride film, either in situ or in a separate chamber from the reactor.

16. The method of claim 15 further comprising performing a plasma treatment on the silicon oxynitride film with an inert gas plasma or hydrogen/inert plasma or nitrogen plasma at a temperature ranging between 25° C. and 600° C.

17. The method according to claim 15, wherein the silicon nitride film is a carbon-doped silicon nitride film, and wherein the step of treating with an oxygen source converts the carbon-doped silicon nitride into a carbon-doped silicon oxynitride film.

18. The method of claim 17 further comprising performing a plasma treatment on the carbon-doped silicon oxynitride film with an inert gas plasma or hydrogen/inert plasma or nitrogen plasma at a temperature ranging between 25° C. and 600° C.

* * * * *